US005400222A

United States Patent [19]

Nelsen et al.

[11] Patent Number: 5,400,222

[45] Date of Patent: Mar. 21, 1995

[54] L CONNECTORS FOR AN EXTENSIBLE COMPUTER BUS

[75] Inventors: Stephen P. Nelsen; Samuel M. Babb, both of Ft. Collins, Colo.

[73] Assignee: Hewlett-Packard Company, Palo Alto, Calif.

[21] Appl. No.: 15,488

[22] Filed: Feb. 8, 1993

[51] Int. Cl.[6] .................... H05K 1/02

[52] U.S. Cl. .................... 361/804; 361/742; 361/736; 361/790; 361/791; 439/74; 439/75

[58] Field of Search .................... 174/253; 361/803, 804, 361/742, 729, 736, 785, 790, 791, 735; 439/44, 45, 65, 66, 68, 69, 74, 75

[56] References Cited

U.S. PATENT DOCUMENTS 4,528,500 7/1985 Lightbody .................... 324/73 PC
5,127,837 7/1992 Shah et al. .................... 439/71
5,277,595 1/1994 Clark .................... 439/75

*Primary Examiner*—Leo P. Picard
*Assistant Examiner*—L. Thomas
*Attorney, Agent, or Firm*—Patrick J. Murphy

[57] ABSTRACT

An extensible bus assembly provides very short, uniform stub lengths from a bus transceiver to the bus assembly. The extensible bus assembly includes a bus termination cap, a plurality of extenders and an anchor. Each bus assembly element is L-shaped so that the bus transceiver, or some similar bus driver, may be positioned in close proximity to the bus assembly by placing the bus transceiver in the "corner" of the L; this ensures short, uniform stub lengths. Conductive surfaces are vertically positioned within the termination cap and plurality of extenders. The conductive surfaces may be compliant pins and/or spring-loaded wire conductors.

8 Claims, 5 Drawing Sheets

L CONNECTORS FOR AN EXTENSIBLE COMPUTER BUS

BACKGROUND OF THE INVENTION

1. Field of the Invention

The present invention relates generally to computer bus assemblies and interconnects and more particularly to an extensible bus assembly with L-shaped interconnection devices.

2. Description of the Prior Art

Interconnections between a microcomputer bus system and the various electronic devices within a computer are typically fashioned via a plurality of signal line stub lengths. A common bus structure is the synchronous backplane interconnect (SBI). The term "bus" herein means a conductor used for transmitting data and/or power signals. The SBI is basically a straight transmission line located along the rear of the computer casing. Since the SBI is a straight line, stub length interconnections from the various devices will vary greatly (i.e., devices within the computer cannot all be positioned immediately adjacent to the bus). For example, the communication path between the central processing unit (CPU) and a memory unit will have two differing stub length interconnects where the first stub length from the CPU to the bus might be longer than the second stub length from the bus to memory.

One problem with this bus interconnect arrangement is signal reflection which occurs due to the different stub lengths attached at various locations along the straight bus. Each stub length will have a characteristic reflection problem dependent on the geometries of the stub length, as well as the frequency of the signal and the edge rate (i.e., the slope of a signal which travels along the stub). In the example above, one would expect to encounter greater signal reflection on the interconnect between the CPU and the bus, than the interconnect between the bus and memory.

In addition to the reflection problem, varying stub lengths create varying impedances. As with the signal reflection problem, characteristic impedance based on the stub length further impedes signal strength and fidelity thereby increasing overall signal distortion. Varying impedances are also encountered along loaded and unloaded portions of the SBI. Portions of the SBI which support a load (i.e., some circuitry) will have a different characteristic impedance than a portion of the SBI which is unloaded.

Further, prior art bussed system interconnect geometries such as the SBI have a restricted profile. The prior art bus profiles have a lower limit based on the length of the bus structure and the number of devices connected to the bus. In other words, the bus profile can only be so small, given that the bus, which comprises one straight transmission line along the rear of the computer casing, must accommodate a number of input/output (I/O) printed circuit boards which are plugged into the bus. The only way to reduce the bus' profile is to reduce the number of I/O boards, or cards, which are plugged into the bus; this cannot be done below a certain necessary minimum number of I/O cards.

Another problem of prior art computer bus structures is the limited number of cards which can be plugged into the bus. Microcomputer bus systems generally contain a set number of used and unused slots. Once the unused slots are fully occupied, the only method of adding additional devices is to add a bus extender. The bus extender device adds to the cost of the bus system and introduces an additional source for signal distortion. Further, bus extenders typically result in performance degradation which must be accommodated by introducing wait states into the data transmission schemes.

It would be advantageous if a bus system interconnect could have uniform stub lengths such that the signal distortion problems associated with reflection and impedance would be substantially lessened. A bus system without unloaded portions would further decrease signal impedance.

Further advantages would be realized if the interconnects provided a lower profile than conventional bussed system interconnects, and if the bus system was inherently extensible which would obviate the need for wait states.

SUMMARY OF THE INVENTION

The disadvantages and limitations of the prior art have been overcome by the present invention which provides an L-shaped bus interconnection device. In particular, the L-shaped connector allows for very short, fixed stub lengths from the bus to the various devices within a microcomputer. These short, uniform stubs significantly reduce the signal reflection and impedance problems common in prior art bus assemblies. Further, the overall profile of the bus system which incorporates the L-shaped connector is significantly smaller than conventional bus structures.

The L-shaped connector also provides bus extensibility; that is, various bus lengths are facilitated by simple insertion of a plurality of extension components. This extensibility highlights a feature of the present invention—a build-as-you-go scheme for constructing the bus. Using the L-shaped connectors, one may create a bus which has the exact bus length required. In other words, the length of the bus will be dictated by the number of devices used within the microcomputer. Since there are no unloaded bus portions, this configuration will not have the additional impedance problems characteristic of a loaded/unloaded bus system.

Basically, the L-shaped bus connector comprises a bus termination cap, an anchor, and at least two attachment screws. Both the bus termination cap and the anchor are L-shaped and are substantially the same size. The bus termination cap and anchor, both having attachment apertures, are held securably in place by the attachment screws. An L-shaped extender is provided so that the bus may be extended. The L-shaped extender is positioned between the termination cap and anchor. While the number of extenders used in any one bus structure is unlimited, it will generally be some number $n-1$, where n is the number of devices used in a particular microcomputer application.

Another feature of the L-shaped bus connector is the alignment sleeves that provide mechanical registration for the entire assembly. Both the extenders and the anchor have alignment sleeves which are affixed at the attachment apertures. These sleeves provide overall mechanical stability and alignment to the bus assembly when inserted into the attachment aperture of the adjacent extender or termination cap.

The attachment screws have first and second ends. The first end has a larger diameter than the second end. Additionally, the first end also has an aperture and threads which can accommodate the second end. In this manner, sets of attachment screws are placed in series, one set per extender, so that the final bus assembly has vertical extension.

The extenders, together with the bus termination cap and anchor, form a communication path, or bus, when connected. Conductive means are provided to carry the signal, ground and power lines through the L-shaped bus assembly. In one embodiment, the conductive means comprises a compliant pin. In another embodiment, the means are spring-loaded wire conductors. Still another embodiment would have the means as compliant, electrically anisotropic materials.

The geometry of the L-connector is such that bus transceivers, or some similar driver device, can be positioned in close proximity to the bus. In other words, each bus transceiver is placed within the "corner" of the L-connector. This configuration yields short, uniform stub lengths. Further, a variety of device sizes can be placed within the L-shaped corners.

BRIEF DESCRIPTION OF THE DRAWINGS

These and other objects and advantages of the invention will become more apparent and more readily appreciated from the following detailed description of the preferred embodiment of the invention taken in conjunction with the accompanying drawings of which.

DETAILED DESCRIPTION OF THE PREFERRED EMBODIMENT

Figure 1:
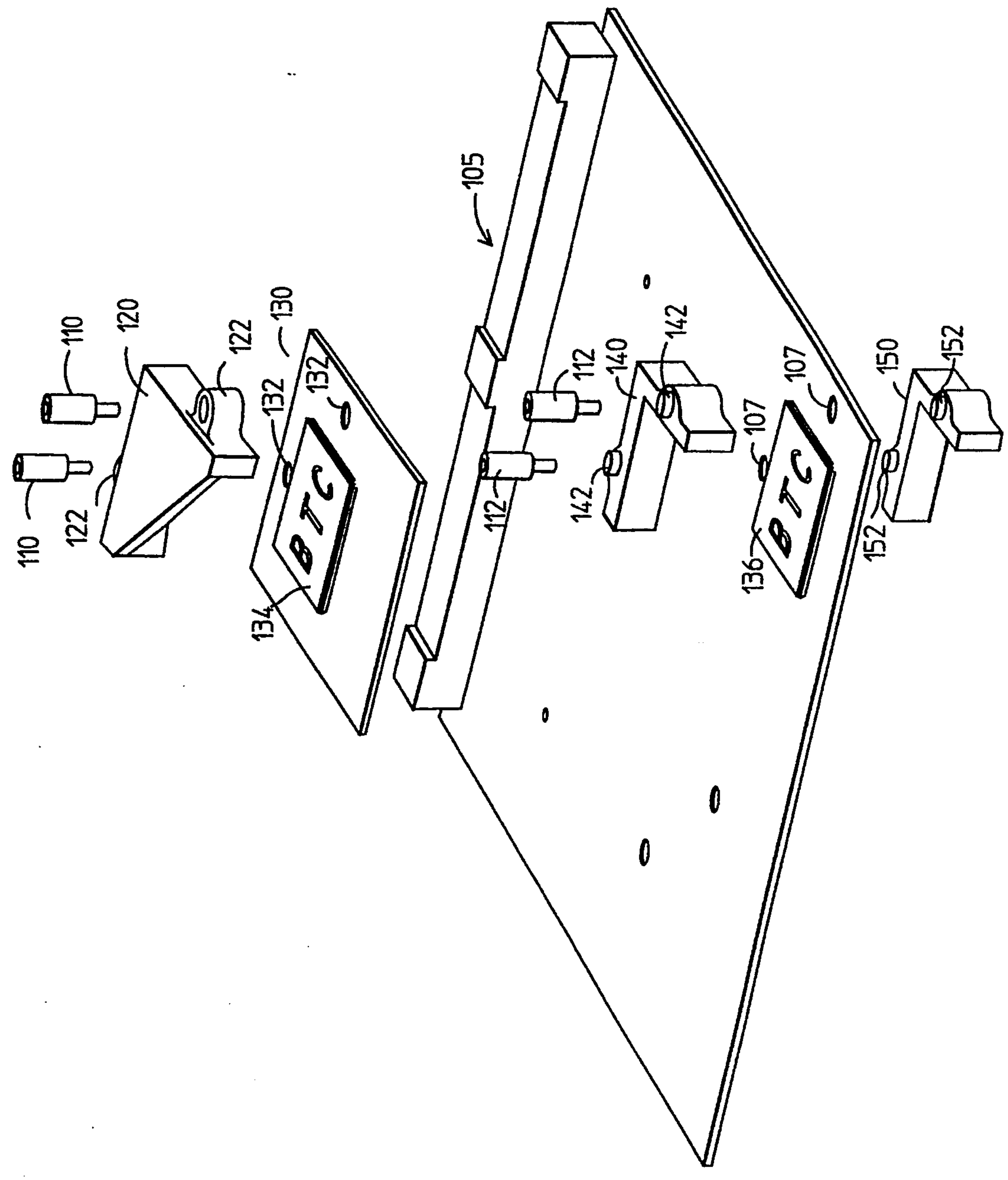
FIG. 1 shows an exploded view of the extensible bus assembly according to the present invention.

FIG. 1 shows an exploded view of the extensible bus assembly, including the L-shaped connector. The L-shaped connector comprises a bus termination cap, an anchor and attachment screws. In a preferred embodiment, a plurality of extenders are disposed between the bus termination cap and the anchor to provide vertical extension to the bus assembly.

A printed circuit board, or motherboard 105, provides a foundation for the extensible bus assembly. An input/output (I/O) board 130 is connected to the motherboard 105 via the bus assembly. Land patterns and vias (see FIG. 2) on the boards 105, 130 provide a path for electrical transmission when the extensible bus assembly is constructed and set in place on the motherboard 105. The geometry of the bus assembly (i.e., L-shaped) is such that very short, uniform stub lengths are effected from the bus assembly to the land patterns. Alignment apertures 107, 132 are provided to align the bus assembly as will be discussed more fully below.

The I/O board 130 comprises a first bus transceiver 134 which is electrically coupled to the bus. The bus transceiver 134 is essentially a bus driver that can buffer data in either direction (i.e., to or from the bus). It should be understood that any device which facilitates communications between the bus and the various computer devices can be used in place of the bus transceiver 134 without departing from the true spirit of the present invention.

A bus termination cap 120 is disposed above the I/O board 130 and is held securably in place by a first set of attachment screws 110. While this is a preferred embodiment, those with ordinary skill in the art will understand that the bus termination cap 120 may be placed in any relative disposition to the I/O board 130 or motherboard 105, so long as it appears at the "end" of the bus assembly. Within the bus termination cap 120, termination means are provided. In a preferred embodiment, the termination means is a resistor tied to the power signal. Other embodiments may be diode or resistor-capacitor termination means. In fact, any means capable of terminating the bus may be used within the bus termination cap 120.

An extender 140 makes it possible to include a second bus transceiver 136 below the I/O board 130. Conductive means (not shown), which are brought into proper electrical contact with the land patterns on the motherboard 105 and I/O board 130, are vertically positioned within the extender 140. The conductive means are similar to conductive means which are also found within the bus termination cap 120. The extender has alignment sleeves 142 which provide mechanical registration for the bus assembly. This is accomplished when the alignment sleeves 142 are inserted through the alignment aperture 132 and into the attachment aperture 122 of the bus termination cap 120. The extender 140 is held securably in place by a second set of attachment screws 112. A plurality of extenders may be used, each extender needing a set of attachment screws for securably connecting the extender to the bus assembly. The number of extenders needed will be equal to $n-1$, where n is the number of devices connected to the bus assembly; this is in conformance with the build-as-you-go extensible bus assembly scheme of the present invention.

The first set of attachment screws 110 and the second set of attachment screws 112 are connected as will be discussed more fully below with respect to FIG. 4. Note that attachment screws 110 and 112 are in fact the same type of screw which facilitates bus assembly.

An anchor 150 secures the extensible bus assembly to the motherboard 105. The anchor 150 also has alignment sleeves 152 which are geometrically similar to the alignment sleeves 142 of the extender 140. Within the alignment sleeves 152 are threaded means (not shown) into which the attachment screws 112 can be secured. The anchor 150 provides mechanical and electrical stability to the bus assembly by maintaining planar contact to the bottom of the motherboard 105.

Figure 2:
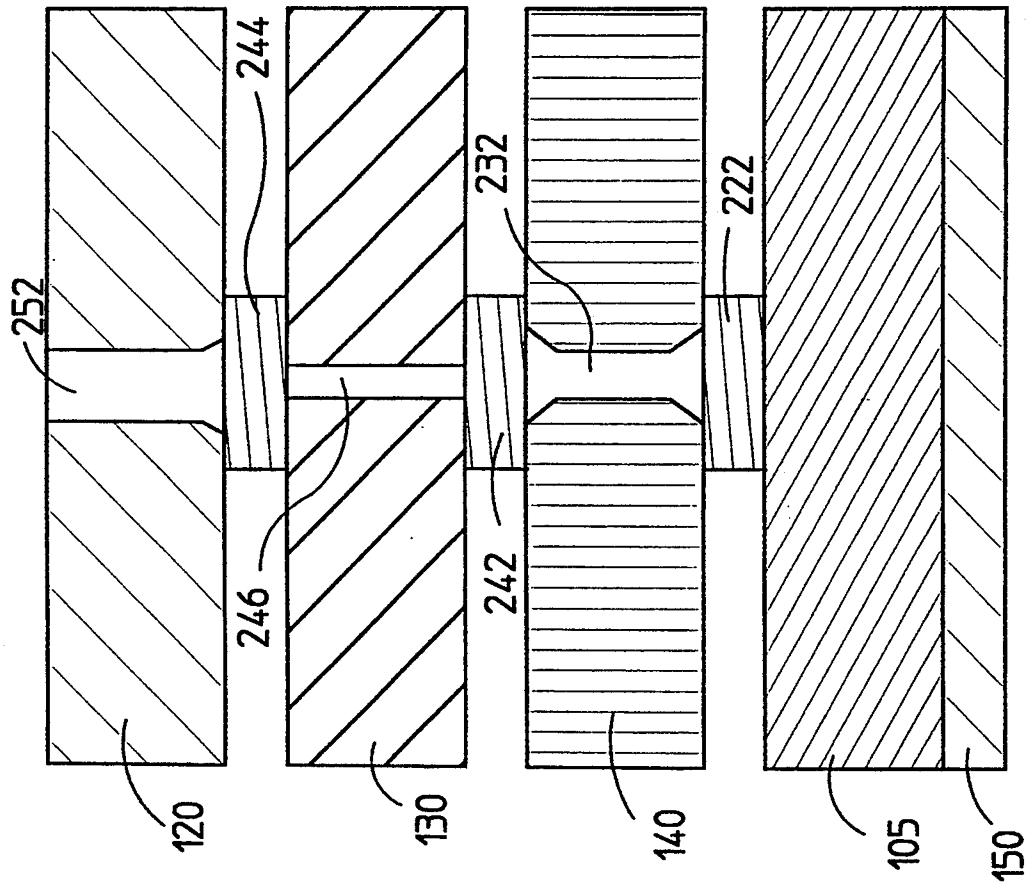
FIG. 2 shows a cross-sectional view of extensible bus assembly.

FIG. 2 shows a cross-sectional view of the extensible bus assembly. The entire bus assembly is constructed with attachment screws and alignment sleeves (as discussed above with respect to FIG. 1) which are not shown here in FIG. 2 to simplify discussion. The anchor 150 is disposed beneath the motherboard 105. The anchor 150 maintains planar contact with the motherboard 105 to provide reliable mechanical and electrical configuration of the entire bus assembly. The motherboard 105 has a first land pattern 222. The land pattern 222 is in proper electrical contact with conductive means 232 of the L-shaped extender 140. Additionally, land pattern 222 is electrically coupled to a first bus transceiver (not shown).

The L-shaped extender 140 is disposed between the motherboard 105 and an input/output (I/O) board 130. The extender 140 provides vertical extensibility to the bus assembly. In addition to being electrically coupled to land pattern 222, conductive means 232 is also electrically coupled to a first land pattern 242 of the I/O board 130. This first land pattern 242 is, in turn, electrically coupled to a second land pattern 244 through a via 246 in the I/O board 130. The second land pattern 244 is electrically coupled to a second bus transceiver (not shown).

The bus termination cap 120 is disposed above the I/O board 130 and is in proper electrical contact with the second land pattern 244 by way of conductive means 252. Conductive means 252 are electrically terminated by some termination means (not shown) which, in a preferred embodiment is a resistor.

Basically, a bus transmission line is created from the land pattern 222 on the motherboard 105, through conductive means 232 to the first land pattern 242 of the I/O board 130, through a via 246 to a second land pattern 244, through conductive means 252 of the termination cap 120. This transmission line may carry a data, ground or power signal. In a preferred embodiment, each element of the transmission line (except for the via 246) is constructed of gold which provides good electrical conduction. It should be understood by those skilled in the art that other conductive materials may be used in place of gold without diverging from the scope of the invention.

Figure 3:
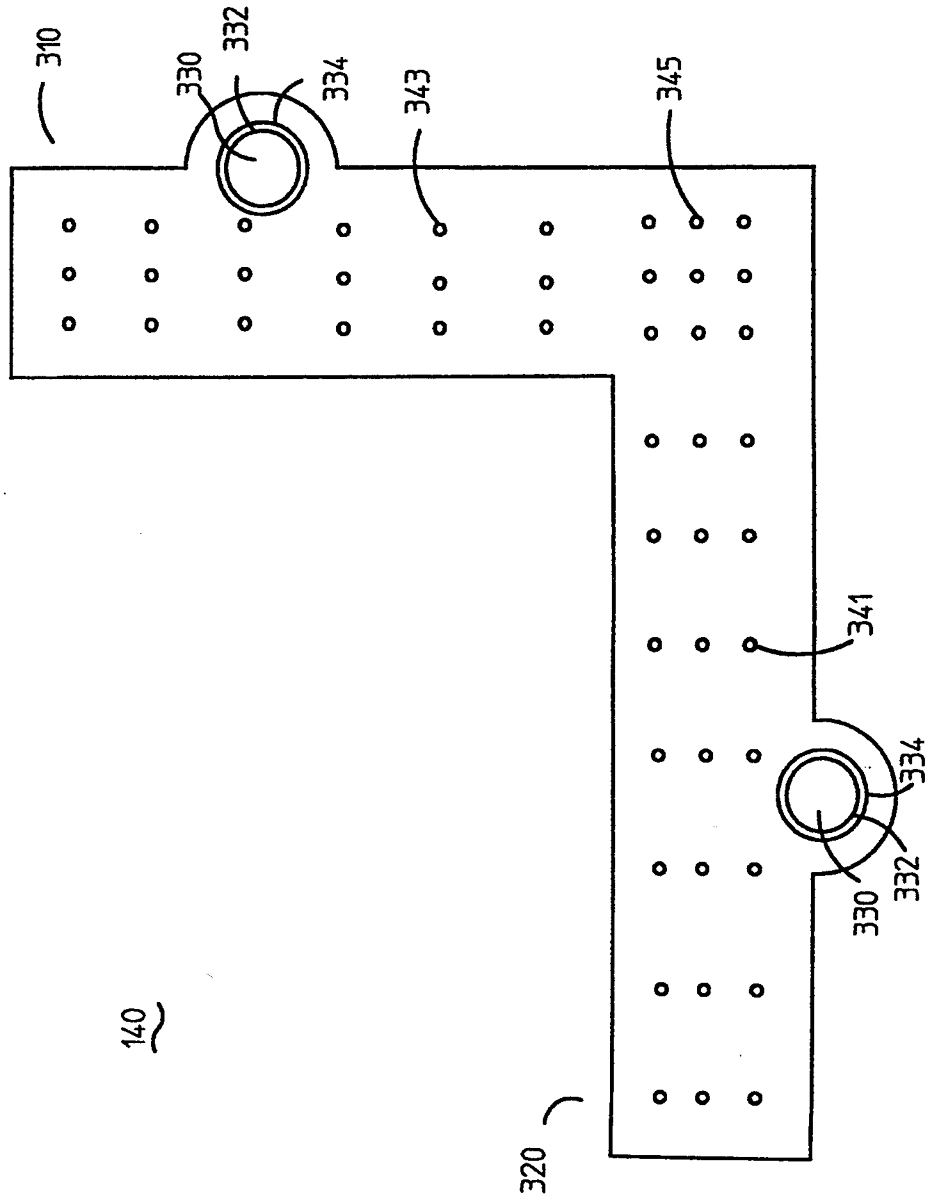
FIG. 3 shows a cross-sectional view of an L-shaped extender according to the present invention.

FIG. 3 shows a cross-sectional view an L-shaped extender according to the present invention. The L-shaped extender 140 comprises a first arm 310 and a second arm 320 of substantially the same length. One end of the first arm 310 is connected to one end of the second arm 320 so that the resulting attachment forms a right angle. Each arm has an attachment aperture 330. The aperture 330 has a predetermined inner diameter 332 which is similar to the diameter of the large end of an attachment screw (not shown), and a predetermined outer diameter 334. The outer diameter 334 provides the mechanical registration for the bus termination cap, extenders and anchor.

Transmission channels are provided to carry data, ground and power signals. In a preferred embodiment, channels along arms 310 and 320 (represented by channels 341 and 343) carry the data and ground signals, while channels at the junction of arms 310, 320 (represented by channel 345) carry the power signal. It will be obvious to those with ordinary skill in the art that any channel can carry any particular signal.

Figure 4:
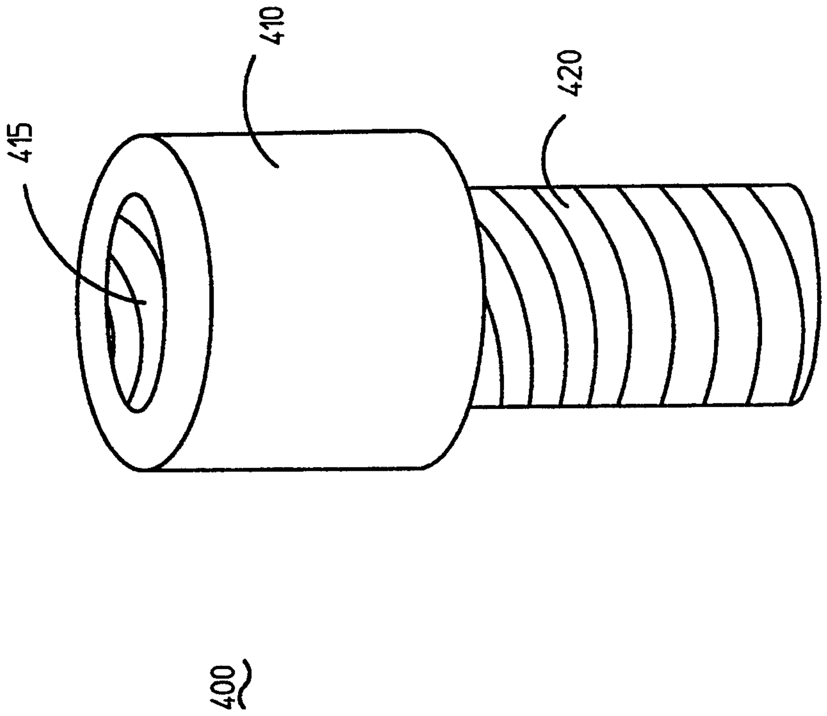
FIG. 4 shows an attachment screw according to the present invention.

FIG. 4 shows an attachment screw according to the present invention. The attachment screw 400 is designed to be used anywhere such a screw is needed. Besides the bus termination cap which utilizes at least two attachment screws, each extender that is used in the construction of the bus assembly will require a set attachment screws. The attachment screw 400 can be broken down into two ends. The first end 410 has substantially the same diameter as the inner diameter of the attachment sleeves of the bus elements. Additionally, the first end 410 has an aperture 415 which has threaded means within. The second end 420 has substantially the same diameter as the aperture 415 and complementary threaded means to match those within the aperture 415. When constructing the extensible bus assembly, the second end 420 of one screw is screwed into the first end 410 of another screw.

Figure 5:
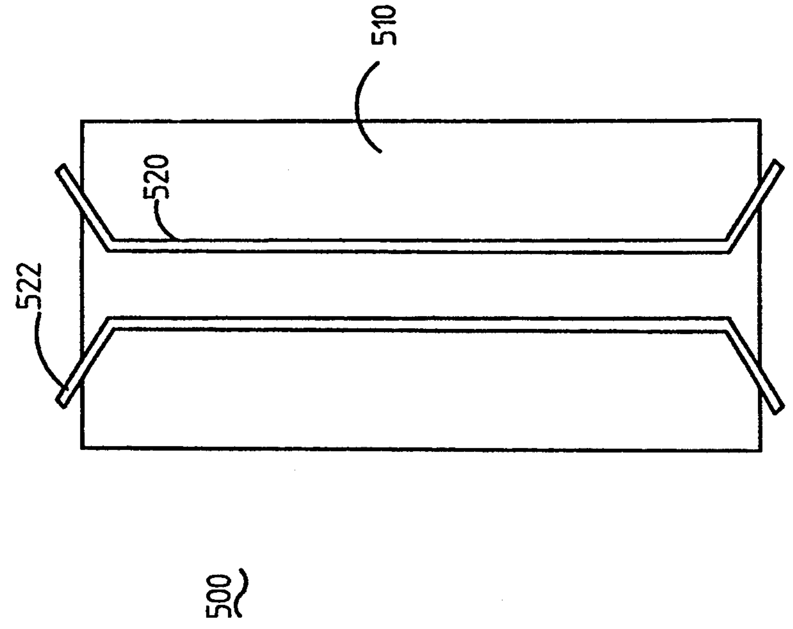
FIG. 5 shows one embodiment of the conductive means according to the present invention.

FIG. 5 shows one embodiment of the conductive means 500 found inside the bus termination cap and extenders. A transmission channel 510 runs vertically through an L-shaped extender, for example. Within the channel 510, a compliant pin 520 is placed. The compliant pin 520 has bent ends 522 which provide the necessary compliance when placed into proper electrical connection to a land pattern or some similar conductive element. In a preferred embodiment, the compliant pin 520 is made of gold.

While the present invention has been illustrated and described in connection with the preferred embodiment, it is not to be limited to the particular structure shown. It should be understood by those skilled in the art that various changes and modifications may be made within the purview of the appended claims without departing from the spirit and scope of the invention in its broader aspects.

We claim:

1. An extensible bus assembly for providing input/output (I/O) communications within a computer system, the computer system having a motherboard with upper and lower surfaces, the extensible bus assembly comprising:

an anchor for stabilizing the extensible bus assembly to the motherboard, the anchor disposed below the lower surface of the motherboard;

a bus termination cap disposed above the upper surface of the motherboard and attached to the anchor;

at least two attachment screws to secure the bus termination cap to the anchor, wherein each of said at least two attachment screws comprises first and second ends, the first end having an aperture with threaded means, the second end having substantially the same diameter as the aperture and complementary threaded means so that the second end of one of said at least two attachment screws can be screwed into the first end of another;

at least one extender disposed between and coupled to the bus termination cap and the anchor, said extender providing elongation to the bus assembly, wherein the extender further comprises a plurality of transmission channels for housing said conductive means, the plurality of transmission channels positioned vertically within the extender; and conductive means for providing electrical service to the extensible bus assembly.

2. An extensible bus assembly comprising:

an L-shaped anchor for stabilizing the bus assembly to a motherboard, the anchor disposed below a lower surface of the motherboard;

an L-shaped bus termination cap disposed above an upper surface of the motherboard and attached to the anchor;

at least one L-shaped extender disposed between and coupled to the bus termination cap and the anchor, said at least one extender providing elongation to the bus assembly, first and second sets of attachment screws, the first set to secure the bus termination cap to said at least one extender, the second set to secure said at least one extender to the L-shaped anchor; and conductive means for providing electrical service to the bus assembly.

3. The extensible bus assembly as recited in claim 1 wherein said conductive means comprise a compliant pin.

4. The extensible bus assembly as recited in claim 1 wherein said conductive means comprise electrically anisotropic material.

5. The extensible bus assembly as recited in claim 2 wherein said conductive means comprise a compliant pin.

6. The extensible bus assembly as recited in claim 2 wherein said conductive means comprise electrically anisotropic material.

7. The extensible bus assembly as recited in claim 3 wherein a bus transmission line is formed when the L-shaped termination cap and said at least one L-shaped extender are brought into proper electrical contact.

8. The extensible bus assembly as recited in claim 4 wherein a bus transmission line is formed when the L-shaped termination cap and said at least one L-shaped extender are brought into proper electrical contact.

* * * * *